United States Patent
Skapa et al.

(10) Patent No.: US 6,268,232 B1
(45) Date of Patent: Jul. 31, 2001

(54) METHOD FOR FABRICATING A MICROMECHANICAL COMPONENT

(75) Inventors: Helmut Skapa; Horst Muenzel, both of Reutlingen; Franz Laermer, Stuttgart; Michael Offenberg, Kirchentellinsfurt; Heinz-Georg Vossenberg, Pfullingen, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/302,224

(22) Filed: Apr. 29, 1999

(30) Foreign Application Priority Data

Apr. 30, 1998 (DE) ............................................. 198 19 456

(51) Int. Cl.$^7$ ..................................................... H01L 21/00
(52) U.S. Cl. .............................. 438/51; 438/52; 257/415; 361/280; 73/514.21; 73/514.32
(58) Field of Search ................................. 438/48, 50, 51, 438/52; 257/414, 415; 73/514.01, 514.16, 514.21, 541.32, 514.35, 514.36, 777; 361/280

(56) References Cited

U.S. PATENT DOCUMENTS 5,550,090 * 8/1996 Ristic et al. ............................ 438/52
5,723,353 * 3/1998 Muenzel et al. ....................... 438/48
5,756,901 * 5/1998 Kurle et al. ............................ 73/777
6,076,404 * 6/2000 Muchow et al. .................. 73/514.32

FOREIGN PATENT DOCUMENTS 195 37 814    4/1997  (DE) .

* cited by examiner

*Primary Examiner*—Olik Chaudhuri
*Assistant Examiner*—Kurt Eaton
(74) *Attorney, Agent, or Firm*—Kenyon & Kenyon

(57) ABSTRACT

A method for fabricating a micromechanical component, in particular a surface-micromechanical acceleration sensor, involves preparing a substrate and providing an insulation layer on the substrate, in which a patterned circuit trace layer is buried. A conductive layer, including a first region and a second region, is provided on the insulation layer, and a movable element is configured in the first region by forming a first plurality of trenches and by using an etching agent to remove at least one portion of the insulation layer from underneath the conductive layer. A contact element is formed and electrically connected to the circuit trace layer in the second region by configuring a second plurality of trenches, and the resultant movable element is encapsulated in the first region. The second plurality of trenches for forming the contact element in the second region is first formed after the encapsulation of the movable element formed in the first region.

6 Claims, 3 Drawing Sheets

METHOD FOR FABRICATING A MICROMECHANICAL COMPONENT

Field of the Invention

The present invention relates to the fabrication of a micromechanical component, in particular a surface-micromechanical acceleration sensor, according to a method that involves preparing a substrate and providing an insulation layer on the substrate in which a patterned circuit trace layer is buried. A conductive layer is provided on the insulation layer, in which the conductive layer includes a first region and a second region. A movable element is configured in the first region by forming first trenches and by directing an etching agent through the first trenches to remove at least one portion of the insulation layer from underneath the conductive layer. A contact element is formed and electrically connected to the circuit trace layer, in the second region by configuring second trenches. The resultant movable element is encapsulated in the first region.

BACKGROUND INFORMATION

German Published Patent Application No. 195 37 814 A1 describes a known method for fabricating a micromechanical acceleration sensor.

Although the present invention as well as the problem definition underlying the present invention are applicable in principle to any micromechanical components, they will be elucidated with reference to this known surface-micromechanical acceleration sensor.

FIG. 2 shows a schematic, cross-sectional representation of the known micromechanical acceleration sensor, fabricated using known methods. FIG. 3 is a schematic plan view of the subject matter of FIG. 2. FIG. 4 is an enlarged schematic representation of the contact region of the known micromechanical acceleration sensor according to FIG. 2 to elucidate the problem definition underlying the present invention.

In FIGS. 2 through 4, reference symbol 100 generally denotes a micromechanical acceleration sensor. The micromechanical sensor includes a substrate 10, a bottom oxide 1, and a top oxide 2. Sensor 100 also includes a printed circuit trace of LPCVD polysilicon 3 buried between the two oxides 1, 2, and top oxide 2 includes contact holes 4. A layer of epitaxial polysilicon 6 (i.e., polysilicon deposited in an epitaxial reactor to achieve a higher deposition rate) is also provided in sensor 100. Further included in sensor 100 are a bonding pad of aluminum 7, a solder glass layer 8, first trenches 9, second trenches 9', and a bonding pad base (socket) 20 of epitaxial polysilicon, also referred to as a contact element. Other elements arranged as elements of the sensor 100 include a frame structure of epitaxial polysilicon 21, a movable element 25 having an anchored region 22 and a free-standing region 23, a polysilicon contact plug 60 as a part of layer 6 of polysilicon, an Si protective cap or wafer cap 13, contact regions B1–B5, circuit trace regions L1–L5, a sensor core region I, a capping (encapsulation) edge area II, a bonding pad region III. Reference character S identifies a dirt particle.

When the known technique is used to fabricate this acceleration sensor, the thicknesses of the various layers are typically as follows:

| | |
|---|---|
| aluminum bonding pad 7: | 1.35 $\mu$m |
| layer 6 of polysilicon: | 10.30 $\mu$m |
| second oxide 2: | 1.60 $\mu$m |
| buried circuit trace layer 3: | 0.45 $\mu$m |
| first oxide 1: | 2.50 $\mu$m |

When the customary technique is performed, patterns are exposed in the 10 $\mu$m thick layer 6 of polysilicon by forming trenches and by removing the underlying sacrificial layer (oxide 1, 2).

To obtain freely movable sensor elements in region I, the undercut-type etching is not only necessary, but also desired. On the other hand, in region III, an undercut-type etching is not at all desired, and would be detrimental for reasons elucidated in the following. Region II is completely covered with polysilicon and is used to hermetically encapsulate the sensor 100 with the aid of the Si protective cap 13.

As is apparent from the enlarged representation of region III in FIG. 4, the 10 $\mu$m thick bonding pad base 20 of polysilicon, which has trenches formed in it in the same process step in which the movable structure is formed in sensor core region I, bears aluminum bonding pad 7 and is connected via contacting plug 60 to the underlying, thin LPCVD polysilicon circuit trace 3. Prior to the etching of the sacrificial layer, LPCVD polysilicon circuit trace 3 is embedded between the two oxide layers 1, 2.

When each of the first and second oxide layer 1, 2 is etched in that region which is simultaneously etched as a sacrificial layer for movable element 25 of the sensor 100, top oxide 2 is completely removed, and lower oxide 1 is partially removed. The result is the undercut-type etching of bonding pad base 20 and of circuit trace layer 3, as described.

At these locations, conductive dirt particles S, produced, in particular, during sawing (slicing) operations as sludge from the saw, can accumulate and lead to electrical shunting between bonding pad base 20 and substrate 10, or between bonding pad base 20 and circuit trace layer 3.

In addition, breaks can occur in the buried circuit trace layer 3 or in the undercut (laterally etched) epitaxial polysilicon edges of bonding pad base 20, particularly during the high-pressure scrubbing performed subsequently to the sawing operation. The consequences are possible shunts, an increased resistance, and dirty break edges.

Generally it is a drawback that, subsequent to the etching of the sacrificial layer, circuit trace layer 3 is no longer covered with a dielectric material; this is in violation of standard IC- design safety regulations.

Generally, therefore, it would be advantageous to implement a method that easily avoids shunts of this kind.

A customary approach used to avoid undercutting the bonding pads provides for covering second trenches 9' around the bonding pads with a negative resist.

In terms of process technique, the disadvantage of this approach is the fact that difficulties arise when working with step heights of more than about 10 $\mu$m, and the fact that this approach is not even practicable for all sensor structures. Also, the negative resist must be removed immediately following the HF (high frequency) gas-phase etching of the sacrificial layer, since the HF causes it to become saturated, so that it can no longer prevent the undercut-type etching. Completely removing the resist in the trenches turns out to be complicated in this context, and even small amounts of residue can cause the comb-type structures to become cemented.

A second approach provides, at least temporarily, an additional protective layer in a designated region underneath and around the bonding pad base on the sacrificial layer to prevent the sacrificial layer from being completely undercut underneath the bonding pad base. This makes the manufacturing process more costly.

SUMMARY OF THE INVENTION

Compared to the known approach for solving the problem definition, the advantage of the method of the present invention is the implementation of an etching step in the manufacturing process that prevents any more undercutting (lateral etching) of the sacrificial layer underneath the bonding pad base, and eliminates the danger of shunts to the circuit traces laid bare around the contact region or of other shunts, for example to the substrate. Also, breaks no longer occur during high-pressure scrubbing operations. Thus, the reliability and proper functioning of the micromechanical component are significantly enhanced.

According to the present invention, the insulation layer in the second region remains protected by the conductive layer when the movable element is formed in the first region.

In other words, the conductive layer is used as a protective layer in that trenches are formed in it only in region I, but not in region III, during etching of the sacrificial layer. Thus, during etching of the sacrificial layer, only the sacrificial layer in the sensor's core region I is removed to produce the movable element. Trenches are expediently formed a second time in the conductive layer following the encapsulation, and, in fact, only in region III, not, however, in region I, since the thick protective capping at this point acts as a mask.

According to one preferred embodiment of the present invention, the second trenches are not formed until the movable element is produced in the first region, preferably not until it is encapsulated. This prevents the etching medium from attaining the insulation layer(s) underneath the contact region, and the circuit traces in the second region, when the movable element is formed.

According to another preferred embodiment of the present invention, a metallization pad is formed on the contact element, and the second trenches are etched to form the contact element in the second region, using the metallization pad as a mask, with the first region being masked by the encapsulation. This eliminates the need for an additional masking level, which would be difficult to implement.

According to another preferred embodiment of the present invention, a window region of the conductive layer is etched free in the region on the insulation layer when the first trenches are formed, and is used as a reference for detecting the etching end point in the first region.

In another preferred embodiment of the present invention, a circuit-trace layer region is embedded as a vertical etching stop in the insulation layer underneath the window region. This prevents the substrate from being exposed during etching of the sacrificial layer.

According to another preferred embodiment of the present invention, the circuit-trace layer region is joined at its edge in such a way to the conductive layer that the conductive layer acts as a lateral etching stop in the direction of the contact element. This prevents an undercut-type etching of the contact element or of the circuit traces.

In another preferred embodiment of the present invention, the substrate and the conductive layer are made of silicon. The process of providing the insulation layer with the patterned circuit trace layer buried therein then expediently includes oxidizing the substrate to form a first oxide layer, depositing and pattering the circuit trace layer on the first oxide layer, and forming a second oxide layer on the patterned circuit trace layer and the surrounding first oxide layer.

DETAILED DESCRIPTION

Figure 1A:
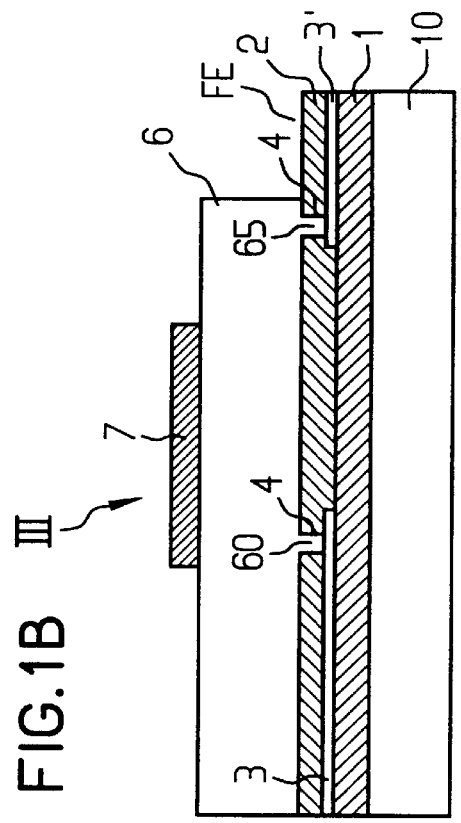
FIG. 1a shows a first schematic cross-sectional representation of a specific embodiment of the method according to the present invention, as applied to a micromechanical acceleration sensor.
Figure 1B:
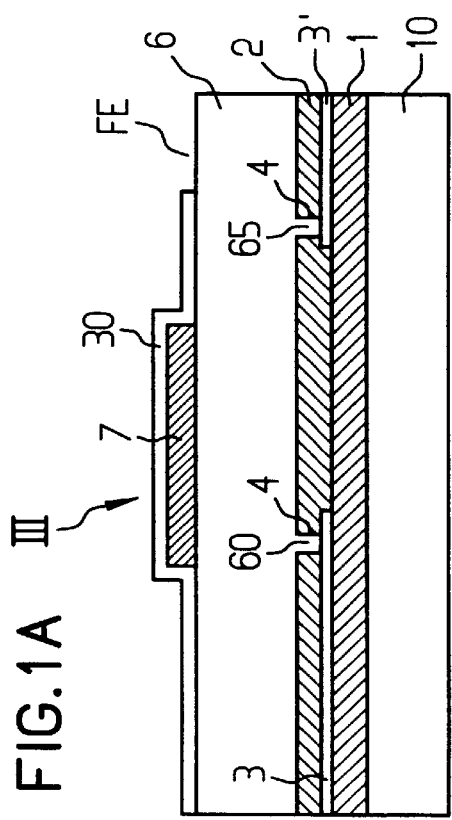
FIG. 1b shows a second schematic cross-sectional representation of the specific embodiment of the method according to the present invention, as applied to a micromechanical acceleration sensor.
Figure 1C:
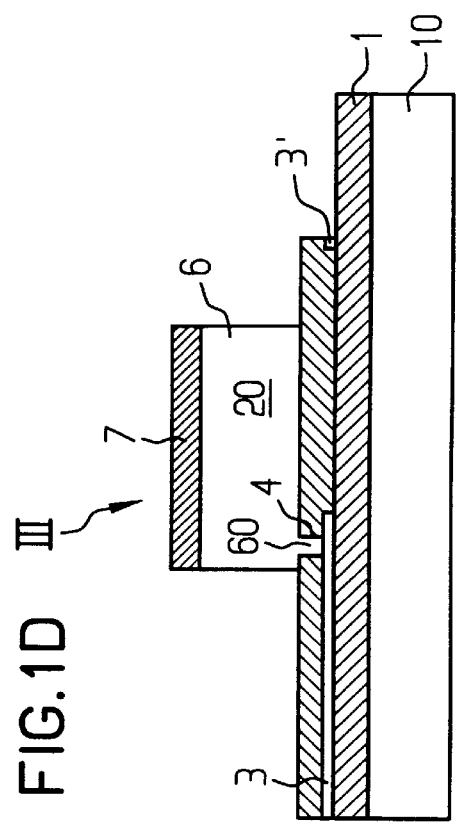
FIG. 1c shows a third schematic cross-sectional representation of the specific embodiment of the method according to the present invention, as applied to a micromechanical acceleration sensor.

In the Figures, the same reference symbols denote identical components or components having identical functions. FIGS 1a–d show a schematic cross-sectional representation of a specific embodiment of the method according to the present invention, as applied to a generally known micromechanical acceleration sensor. For the sake of clarity, only region III of FIG. 2 is shown. For further details pertaining to regions I and II, reference is made, in particular, to the German Published Patent Application No. 195 37 814 A1 mentioned above.

In addition to the elements already discussed, FIGS. 1a–d also show a photosensitive resist layer 30, a circuit-trace layer region 3', which is used as a vertical etching stop, a connection region 65 of conductive layer 6 to circuit-trace layer region 3', which is used as a lateral etching stop, and a window region FE.

Upon silicon substrate 10, a first insulation layer 1 is deposited, and then circuit trace layer 3 is deposited. First insulation layer 1 is an oxide layer with a thickness of about 2.5 $\mu$m, and circuit trace layer 3 is a doped LPCVD polysilicon layer that is about 0.45 $\mu$m in thickness. Subsequently, circuit trace layer 3 is patterned, and a second insulation layer 2 is produced in the form of a second oxide layer with a thickness of about 1.6 $\mu$m on patterned circuit trace layer 3 and on surrounding first oxide layer 1.

In contrast to the known process, circuit-trace layer region 3" is embedded as a later vertical etching stop into insulation layers 1,2, underneath window region FE.

After contact holes 4 are formed in second oxide layer 2 and the surface is coated with a thin layer of LPCVD polysilicon, the epitaxial conductive layer 6 follows in the form of a polysilicon layer of about 10 μm in thickness.

In contrast to the known process, in this context circuit-trace layer region 3' is joined at its edge to conductive layer 6 via segment 65 running through contact hole 4, this segment 65 of conductive layer 6 acting later as a lateral etching stop in the direction of contact element (bonding pad) 20.

On the top side of thick conductive layer 6, patterned aluminum metal layer 7 is then still applied with a thickness of about 1.3 μm for the bonding pads.

The patterned masking of thick conductive layer 6 then follows in a further photolithographic step using photoresist 30 for the subsequent trench etching process.

In contrast to the known process, region III remains covered with photoresist 30, with the exception of window region FE. Movable element 25 is then formed in first region I using generally known methods, namely through the anisotropic plasma etching of first trenches 9 through the thick conductive layer 6 and the subsequent use of an oxide etching agent (gaseous HF) to remove second oxide layer 2 and first oxide layer 1 from underneath movable element 25.

When plasma etching is performed in region III, only the silicon in the region of window FE is etched to determine the end point. Etching the conductive layer 6 in the sensor core region I is, namely, a very critical process, which has a decisive effect on the sensor properties. To achieve a precise process control, so-called optical emission spectroscopy is used to determine the process end point. Satisfactory functioning of this method will only be achieved, for example, when a large enough silicon surface is etched. If, in the first etching, one limits oneself merely to etching the trenches in the first region, i.e., in the sensor core region I, then a reliable end point detection cannot be ensured using this method.

For that reason, in region III, window surface FE in question is made available, which aids in detecting the end point, but is positioned so as not to have any detrimental effect on the contact element 20 or the circuit traces during subsequent etching of the sacrificial layer. During the subsequent oxide etching, it is namely only that region of oxide layer 2 disposed above circuit-trace layer region 3' and, in FIG. 1c, disposed laterally to the right of segment 65, which is etched, without the occurrence of any disturbing undercut-type etching.

During the further course of the process, sensor core region I is completed, with the final securing of Si protective cap 13 to frame 21 using solder glass 8.

It is not until after that, in accordance with the present invention, that contact element 20 is produced separately in region III, enabling contact element 20 to be electrically connected to circuit trace layer 3 via contact plug 60. In the process, metallization pad 7 on contact element 20 is used as a mask during the plasma etching of second trenches 9' surrounding the contact element or bonding pad 20 in region III. This is expedient because, at this point in time, a photo process would hardly be possible any more due to the high topography (380 μm deep holes in the cap 13). Therefore, the etching process is performed without a photomask and, in the process, the thick capping, i.e. encapsulation, protects sensor core region I from the etching agent.

In the region of the contact element 20, where the metallization pads 7 are used as etching masks, the only consideration is a proper selectivity of the etching process, as is given to a sufficient degree in the etching of silicon with respect to aluminum.

At the end of the process, the components are diced by sawing and scrubbed under high pressure.

Figure 1D:
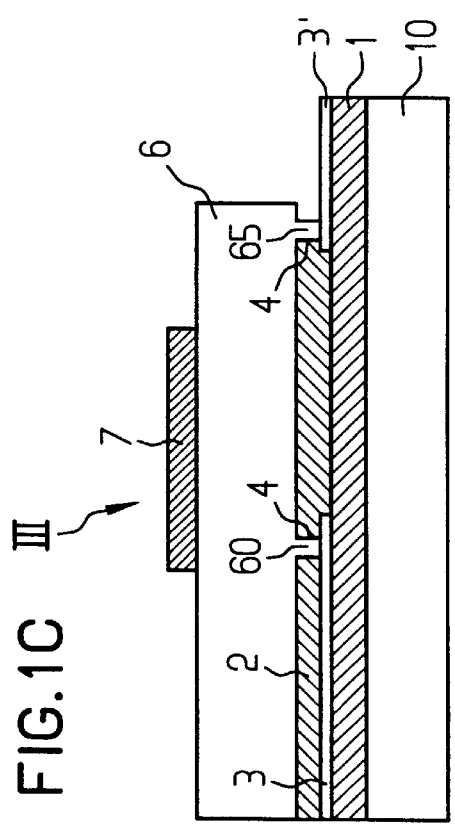
FIG. 1d shows a fourth schematic cross-sectional representation of the specific embodiment of the method according to the present invention, as applied to a micromechanical acceleration sensor.
Figure 2:
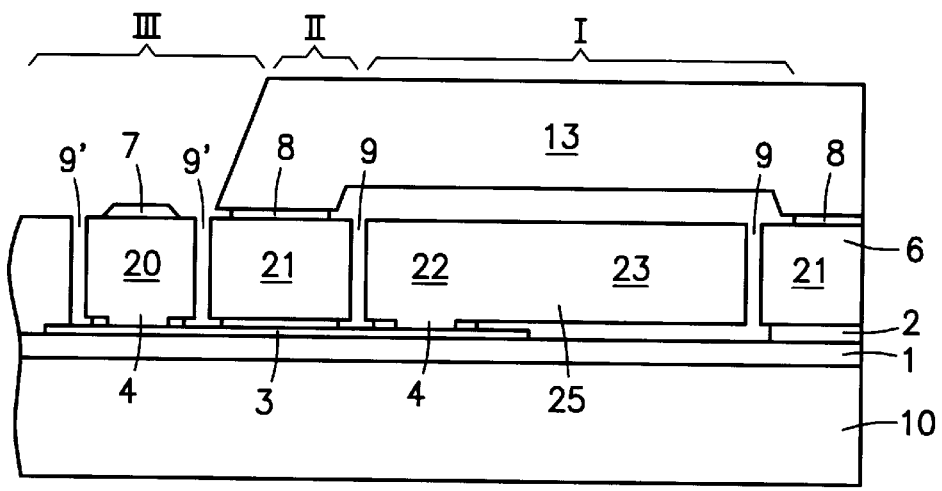
FIG. 2 shows a schematic cross-sectional representation of a known micromechanical acceleration sensor, produced using a customary method.
Figure 3:
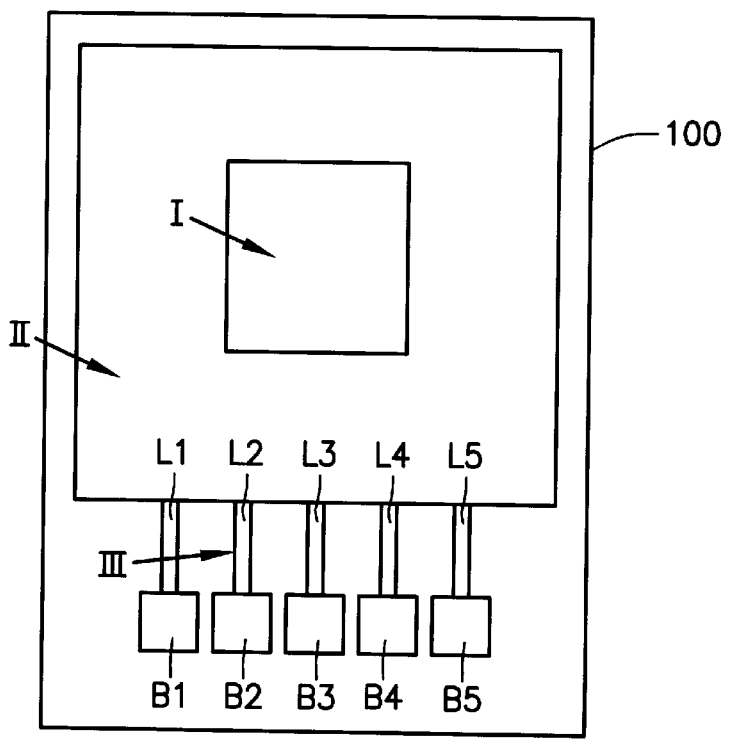
FIG. 3 shows a schematic plan view of the known micromechanical acceleration sensor according to FIG. 2.
Figure 4:
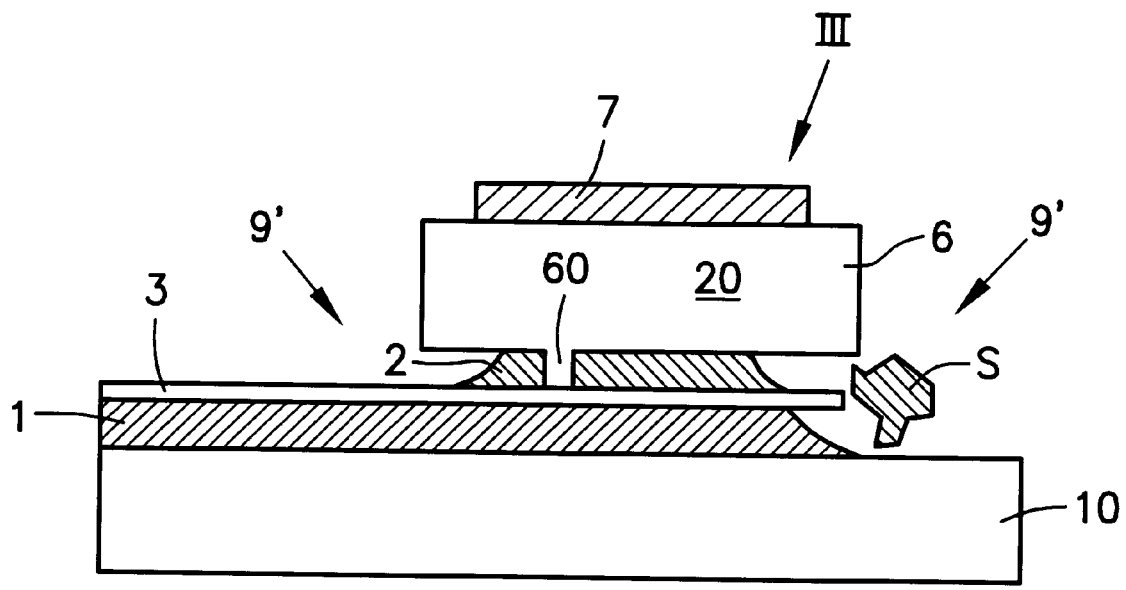
FIG. 4 shows an enlarged schematic representation of the contact region of the known micromechanical acceleration sensor according to FIG. 2.

FIG. 1d shows the cross-section of bonding pad (contact element) 20 of the completed acceleration sensor. Insulation layers 1, 2 are still fully retained underneath and laterally therefrom. In contrast to the known method, the circuit traces in layer 3 are insulated at their top side by second oxide layer 2. As a result, undercut-type etchings and breaks are avoided, and the circuit traces in layer 3 are insulated, thus ruling out any shunts caused by conductive particles.

Although the present invention is explained in the above on the basis of a preferred exemplary embodiment, it is not limited thereto, but rather can be modified in a multitude of ways.

In particular, the bonding pad structure in accordance with the present invention is not only applicable to micromechanical acceleration sensors, but to any micromechanical component structure. In selecting materials for the individual layers, one is not restricted to those indicated. The present invention is not only applicable to silicon components, but also to components made of other micromechanical materials.

What is claimed is:

1. A method for fabricating a micromechanical component corresponding to a surface-micromechanical acceleration sensor, comprising the steps of:
    preparing a substrate;
    providing an insulation layer including a patterned circuit trace layer on the substrate, wherein the patterned circuit trace layer is buried within the insulation layer;
    providing a conductive layer including a first region and a second region on the insulation layer;
    configuring a movable element in the first region by performing the steps of:
    forming a first plurality of trenches, and
    directing an etching agent through the first plurality of trenches to remove at least one portion of the insulation layer from underneath the conductive layer;
    forming a contact element in the second region by configuring a second plurality of trenches, the second plurality of trenches being not formed until the movable element is produced in the first region, the contact element being electrically connected to the patterned circuit trace layer;
    encapsulating the movable element in the first region, wherein the insulation layer in the second region remains protected by the conductive layer when the movable element is formed in the first region; and
    forming a metallization pad on the contact element, wherein the second plurality of trenches are etched by using the metallization pad as a mask, the first region being masked by the encapsulation.

2. The method according to claim 1, wherein the second plurality of trenches is not formed until the movable element is encapsulated.

3. The method according to claim 1, further comprising the step of:
    freely etching a window region of the conductive layer in a third region on the insulation layer when the first plurality of trenches are formed, wherein the window region serves as a reference for detecting an etching end point in the first region.

4. The method according to claim 3, further comprising the step of:
    providing a circuit-trace layer region in the insulation layer underneath the window region as a vertical etching stop for the etching of the conductive layer, wherein the conductive layer and the circuit-trace layer region form an etching stop for an oxide etching.

5. The method according to claim 4, further comprising the step of:

joining an edge of the circuit-trace layer region to the conductive layer so that the conductive layer acts as a lateral etching stop in a direction of the contact element.

6. The method according to claim 1, wherein each one of the substrate and the conductive layer is formed from silicon, and wherein the step of providing the insulation layer with the patterned circuit trace layer buried therein includes the steps of:

oxidizing the substrate to form a first oxide layer, depositing and patterning the patterned circuit trace layer on the first oxide layer, and forming a second oxide layer on the patterned circuit trace layer and the surrounding first oxide layer.

* * * * *